United States Patent
Fang et al.

(10) Patent No.: US 12,506,490 B2
(45) Date of Patent: Dec. 23, 2025

(54) SYSTEM AND METHOD FOR RECONFIGURABLE HYBRID ANALOG-TO-DIGITAL CONVERTER (ADC)

(71) Applicant: Avago Technologies International Sales Pte. Limited, Singapore (SG)

(72) Inventors: Jie Fang, Austin, TX (US); Frank Singor, Austin, TX (US); Hongjie Zhu, Austin, TX (US); Chaoming Zhang, Austin, TX (US); Brian Caldona, Austin, TX (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 242 days.

(21) Appl. No.: 18/496,457

(22) Filed: Oct. 27, 2023

(65) Prior Publication Data

US 2025/0141461 A1    May 1, 2025

(51) Int. Cl.
*H03M 1/12* (2006.01)
*H03M 1/46* (2006.01)

(52) U.S. Cl.
CPC ........... *H03M 1/121* (2013.01); *H03M 1/462* (2013.01)

(58) Field of Classification Search
CPC ......... H03M 1/121; H03M 1/462; H03M 1/12
USPC ........................................ 341/155, 144, 156
See application file for complete search history.

(56) References Cited

U.S. PATENT DOCUMENTS

| | | | |
|---|---|---|---|
| 10,574,250 B1* | 2/2020 | Braswell | H03M 1/1033 |
| 2010/0176977 A1* | 7/2010 | Ranganathan | H03M 1/002 |
| | | | 341/122 |
| 2018/0167076 A1* | 6/2018 | Hossain | H04L 25/03 |
| 2019/0305790 A1* | 10/2019 | Kinyua | H03M 1/0612 |
| 2023/0417799 A1* | 12/2023 | Park | H03M 1/1215 |

FOREIGN PATENT DOCUMENTS

EP      2 924 880 A1      9/2015

OTHER PUBLICATIONS

Awad et al., "Digitally-Calibrated Reconfigurable Analog-to-Digital Converters," Ph.D. Dissertation from UCLA, 2013, available online at https://escholarship.org/uc/item/4pk9j721, 135 pgs.

Hsu et al., "A 7b 1.1GS/s Reconfigurable time-interleaved ADC in 90nm CMOS," IEEE Symp. VLSI Circuits, pp. 66-67, Jun. 2007.

Mulder et al., "An 800MS/s 10b/13b Receiver for 10GBASE-T Ethernet in 28nm CMOS," IEEE International Solid-State Circuits Conference, 2015, 3 pgs.

(Continued)

*Primary Examiner* — Peguy Jean Pierre
(74) *Attorney, Agent, or Firm* — Foley & Lardner LLP

(57) ABSTRACT

A system may include a first analog-to-digital converter (ADC) of a first type electrically coupled by a plurality of switches to a plurality of ADCs of a second type. The plurality of switches may be configured to select, based on a rate of an analog-to-digital conversion, a quantity of ADCs of the second type, from among the plurality of ADCs of the second type, to supply the analog-to-digital conversion at the rate. The plurality of switches may be configured to selectively bypass the first ADC according to a resolution of the analog-to-digital conversion. The plurality of switches may be configured to bypass the first ADC responsive to the resolution of the conversion being below a threshold.

20 Claims, 5 Drawing Sheets

(56) References Cited

OTHER PUBLICATIONS

Extended European Search Report on EP Appln. No. 24199797.2 dated Mar. 17, 2025.
Hsu Cheng-Chung et al: "A 7b 1. IGS/s Reconfigurable Time-Interleaved ADC in 90nm CMOS", 2007 IEEE Symposium on VLSI Circuits, Jun. 14, 2007 (Jun. 14, 2007}, pp. 66-67.
Pavan Shanthi et al: "Analysis and Design of Wideband Filtering ADCs Using Continuous-Time Pipelining", IEEE Journal of Solid-State Circuits, IEEE, USA, vol. 59, No. 1, Jan. 1, 2024, pp. 268-281.

* cited by examiner

5000

Selecting, by a plurality of switches coupling a first analog-to-digital converter (ADC) of a first type to a plurality of ADCs of a second type, according to a rate of an analog-to-digital conversion, a quantity of ADCs of the second type, from among the plurality of ADCs of the second type, to provide the rate of the analog-to-digital conversion 502

Responsive to a resolution of the analog-to-digital conversion being below a threshold, bypassing, by the plurality of switches, the first ADC 504

Responsive to the resolution of the analog-to-digital conversion being greater than or equal to the threshold, connecting, by the plurality of switches, the first ADC to the selected quantity of ADCs of the second type 506

FIG. 5

SYSTEM AND METHOD FOR RECONFIGURABLE HYBRID ANALOG-TO-DIGITAL CONVERTER (ADC)

FIELD OF THE DISCLOSURE

This disclosure generally relates to systems and methods for analog-to-digital converters (ADCs), and more particularly to reconfiguring a hybrid ADC that includes different types of ADCs, for multiple communication systems.

BACKGROUND

Applications in data communications, for example, Ethernet applications, may provide ADCs that can support multiple communication standards (e.g., 10 Gigabit Ethernet, 5 Gigabit Ethernet, 2.5 Gigabit Ethernet, 1 Gigabit Ethernet, etc.). In some cases, a dedicated ADC can be used for each communication mode (or standard), but multiple dedicated ADCs would occupy a large area while each dedicated ADC is less versatile in the communication applications. Moreover, multiple dedicated ADCs would increase the number of intellectual properties blocks (IP blocks) incurring additional cost. An IP block refers to a reusable unit of logic, cell, or integrated circuit layout design that is the intellectual property of one party. On the other hand, an ADC with a highest resolution and a highest speed can be used to support multiple communication modes (or standards). In this case, however, the use of such high performance ADC would cause low power efficiency in some of the multiple communication modes that do not require such high performance.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 5 is a flow diagram showing a process of reconfiguring a hybrid ADC including different types of ADCs, in accordance with an embodiment.

Figure 1:
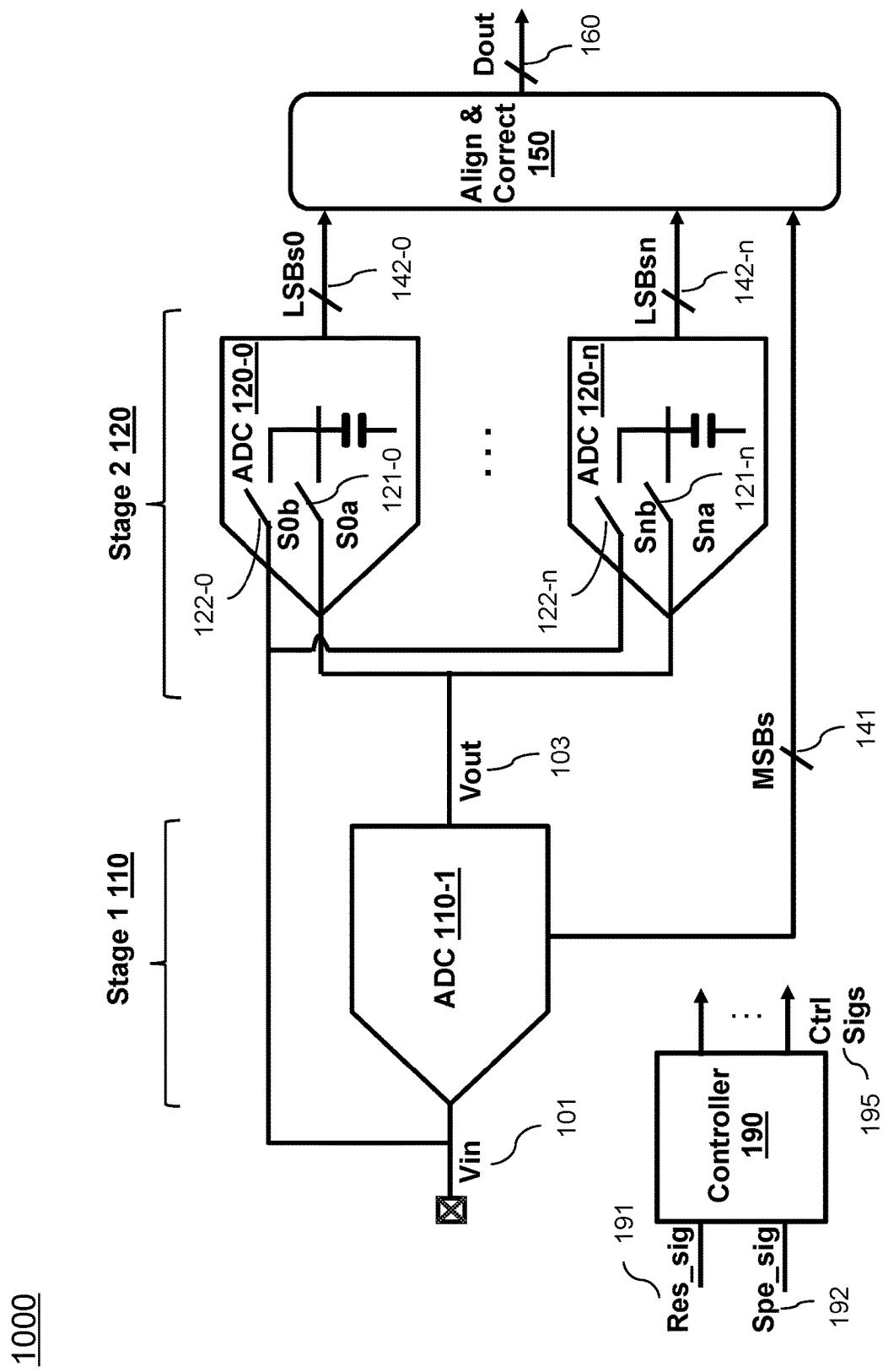
FIG. 1 is a schematic block diagram of a reconfigurable hybrid ADC including different types of ADCs, in accordance with an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. Embodiments and examples in the disclosure may omit various components without precluding the use of additional components with the embodiments. Further, while the drawings and descriptions of embodiments in the disclosure may depict components as being directly connected or in direct electrical contact, that does not preclude the use of additional intervening components with the embodiments. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a system. The system includes a first analog-to-digital converter (ADC) of a first type electrically coupled by a plurality of switches to a plurality of ADCs of a second type. In some embodiments, the first ADC of the first type may function as a first-stage ADC of the first type, and the plurality of ADCs of the second type may function as a second-stage ADCs of the second type. In some embodiments, each of the plurality of switches may be one or more transistors (e.g., metal-oxide-semiconductor field-effect transistor (MOSFET), power transistor, bipolar junction transistor (BJT), insulated-gate bipolar transistor (IGBT), etc.), an analog switch, a silicon controlled rectifier (SCR), a gate turn-off thyristor (GTO), or any electronic switch that can change the conductivity of a path in electrical circuits between two states (e.g., on and off, closed and open, connected and disconnected). The plurality of switches may be configured to select, based on a rate of an analog-to-digital conversion (e.g., a target rate of an analog-to-digital conversion), a quantity of ADCs of the second type, from among the plurality of ADCs of the second type. In some embodiments, the selection may be performed such that the system can supply the analog-to-digital conversion at the target rate. In some embodiments, configurations of components that are "configured to do X, Y, Z" may encompass hardware configurations, software configurations, firmware configurations, and combinations thereof, and configuration achieved though interaction with other components. For example, a switch plus other components with which the switch interacts, either directly or indirectly, may result in the switch being configured to do X, Y, Z. In some embodiments, the rate of the analog-to-digital conversion may be a speed of the analog-to-digital conversion, a sampling rate of the analog-to-digital conversion, or a number of readings, samplings or conversions of analog signals completed per second.

In some embodiments, the plurality of switches may be configured to selectively bypass the first ADC according to a resolution of the analog-to-digital conversion. The plurality of switches may be configured to bypass the first ADC responsive to the resolution of the conversion being below a threshold. For example, if a target resolution of the analog-to-digital conversion is low (e.g., below the threshold), one or more ADCs of the second type can achieve the target resolution without using the first ADC of the first type.

In this case, the first ADC of the first type can be turned off or deactivated or disconnected from the ADCs of the second type, and an input analog signal can be directly provided to the one or more ADCs of the second type, thereby bypassing the first ADC of the first type.

In some embodiments, the first ADC of the first type may include a multiplying digital-to-analog converter (MDAC). The first type of ADC may be different from the second type of ADCs.

In some embodiments, the plurality of ADCs of the second type may include time-interleaved successive approximation register (SAR) ADCs. In some embodiments, the selected quantity of ADCs of the second type increases as the rate of the analog-to-digital conversion increases.

In some embodiments, the plurality of switches may include a plurality of multiplexers respectively electrically coupled to the plurality of ADCs of the second type. Each multiplexer may be configured to selectively bypass the first ADC responsive to the resolution of the conversion being below the threshold.

In some embodiments, in response to receiving an input signal, the first ADC may be configured to convert the input signal to a first digital signal (e.g., a coarse digital signal) and output an analog signal (e.g., an analog residue signal which is from the input signal minus the coarse digital signal). In response to receiving the analog signal, the plurality of ADCs of the second type may be configured to convert the analog signal into a second digital signal (e.g., a digital signal different from the first digital signal).

Various embodiments disclosed herein are related to a method. The method includes selecting, by a plurality of switches coupling a first analog-to-digital converter (ADC) of a first type to a plurality of ADCs of a second type, based on a rate of an analog-to-digital conversion (e.g., a target rate of an analog-to-digital conversion), a quantity of ADCs of the second type, from among the plurality of ADCs of the second type. In some embodiments, the first ADC of the first type may function as a first-stage ADC of the first type, and the plurality of ADCs of the second type may function as a second-stage ADCs of the second type. In some embodiments, the selection may be performed such that the system can provide the target rate of the analog-to-digital conversion. The method may include responsive to a resolution of the analog-to-digital conversion being below a threshold, bypassing, by the plurality of switches, the first ADC. The method may include responsive to the resolution of the analog-to-digital conversion being greater than or equal to the threshold, connecting, by the plurality of switches, the first ADC to the selected quantity of ADCs of the second type.

In some embodiments, the first ADC of the first type may include a multiplying digital-to-analog converter (MDAC). The first type of ADC may be different from the second type of ADCs.

In some embodiments, the plurality of ADCs of the second type may include time-interleaved successive approximation register (SAR) ADCs. In some embodiments, the selected quantity of ADCs of the second type increases as the rate of the analog-to-digital conversion increases.

In some embodiments, the plurality of switches may include a plurality of multiplexers respectively electrically coupled to the plurality of ADCs of the second type. In bypassing the first ADC, responsive to the resolution of the analog-to-digital conversion being below the threshold, each multiplexer may bypass the first ADC. In connecting the first ADC to the selected quantity of ADCs of the second type, responsive to the resolution of the analog-to-digital conversion being greater than or equal to the threshold, the plurality of multiplexers may connect the first ADC to the selected quantity of ADCs of the second type.

In some embodiments, in response to receiving an input signal, the first ADC may convert the input signal to a first digital signal (e.g., a coarse digital signal) and output an analog signal (e.g., an analog residue signal which is from the input signal minus the coarse digital signal). In response to receiving the analog signal, the plurality of ADCs of the second type may convert the analog signal to a second digital signal (e.g., a digital signal different from the first digital signal).

Various embodiments disclosed herein are related to a system. The system includes a plurality of analog-to-digital converters (ADCs) of a first type electrically coupled to a plurality of switches, each ADC of the first type being electrically coupled by a respective switch to a plurality of ADCs of a second type. Each switch may be configured to select, based on a rate of an analog-to-digital conversion, a quantity of ADCs of the second type, from among the plurality of ADCs, to supply the analog-to-digital conversion at the rate. Each switch may be configured to selectively bypass the respective ADC of the first type according to a resolution of the analog-to-digital conversion. Each switch may be configured to bypass the respective ADC of the first type responsive to the resolution of the conversion being below a first threshold.

In some embodiments, each ADC of the first type includes a multiplying digital-to-analog converter (MDAC). In some embodiments, the plurality of ADCs of the second type may include time-interleaved successive approximation register (SAR) ADCs. In some embodiments, the selected quantity of ADCs of the second type may increase as the rate of the analog-to-digital conversion increases.

In some embodiments, each switch may include a plurality of multiplexers respectively electrically coupled to the plurality of ADCs of the second type. Each multiplexer may be configured to selectively bypass the respective ADC of the first type responsive to the resolution of the conversion being below the threshold. In some embodiments, the system may include a plurality of ADCs of a third type respectively electrically coupled to the plurality of ADCs of the first type, and a plurality of further switches respectively electrically coupled to the plurality of ADCs of the third type. Each further switch may be configured to selectively bypass the respective ADC of the third type according to the resolution of the analog-to-digital conversion. Each further switch may be configured to bypass the respective ADC of the third type responsive to the resolution of the conversion being below a second threshold that is greater than the first threshold.

In some embodiments, the system may include a controller configured to determine a quantity of switches, among the plurality of switches, that respectively turn on the selected quantity of ADCs of the second type. The controller may determine a first rate of an analog-to-digital conversion as a result of the quantity of switches respectively turning on the selected quantity of ADCs of the second type. The controller may determine whether the first rate of the analog-to-digital conversion is less than the rate of the analog-to-digital conversion. Responsive to determining that the first rate of the analog-to-digital conversion is less than the rate of the analog-to-digital conversion, the controller may increase the selected quantity of ADCs of the second type to a second quantity of ADCs of the second type. The controller may determine a second rate of an analog-to-digital conversion as a result of the quantity of switches respectively turning on the second quantity of ADCs of the second type. The controller may determine whether the second rate of the analog-to-digital conversion is less than the rate of the analog-to-digital conversion. Responsive to determining that the second rate of the analog-to-digital conversion is less than the rate of the analog-to-digital conversion, the controller may increase the quantity of switches to a second quantity of switch. The controller may control the second quantity of switches to respectively turn on the second quantity of ADCs of the second type.

Various embodiments disclosed herein are related to an analog-to-digital converter (ADC). The ADC may include a plurality of hybrid ADCs in respective channels and a controller. Each of the plurality of hybrid ADCs may include one or more ADCs of a first type and a plurality of ADCs of a second type. An ADC of the second type may have power efficiency greater than power efficiency of an ADC of the first type. The controller may be configured to determine a first quantity indicating a number of ADCs of the second type and a second quantity indicating a number of channels. The controller may be configured to control (1) the second quantity of hybrid ADCs, among the plurality of hybrid ADCs, in the second quantity of channels and (2) the first quantity of ADCs of the second type, among the plurality of ADCs of the second type, in each of the second quantity of channels, to perform a first analog-to-digital conversion. Responsive to determining that a speed of the first analog-to-digital conversion is less than a first speed, the controller may be configured to control the second quantity of hybrid ADCs in the second quantity of channels and a third quantity of ADCs of the second type in each of the second quantity of channels to perform a second analog-to-digital conversion, the third quantity being greater than the first quantity. Responsive to determining that a speed of the second analog-to-digital conversion is less than the first speed, the controller may be configured to control a fourth quantity of hybrid ADCs in the fourth quantity of channels and the third quantity of ADCs of the second type in each of the fourth quantity of channels to perform a third analog-to-digital conversion, the fourth quantity being greater than the second quantity.

In one aspect, applications in data communications, for example, Ethernet applications or receivers for communication systems, may provide ADCs that can support multiple communication standards. In some cases, a dedicated ADC can be used for each communication mode (or standard), but multiple dedicated ADCs would occupy a large area while each dedicated ADC is less versatile in the communication applications. Moreover, multiple dedicated ADCs would increase the number of intellectual properties blocks (IP blocks) incurring additional cost. On the other hand, an ADC with a highest resolution and a highest speed can be used to support multiple communication modes (or standards). In this case, however, the use of such high performance ADC would cause low power efficiency in some of the multiple communication modes that do not require such high performance.

To solve this problem, according to certain aspects, embodiments in the present disclosure relate to a technique to achieve greater power efficiency in multi-standard communication systems via a reconfigurable architecture of a hybrid ADC including different types of ADCs. In some embodiments, the reconfigurable architecture can allow a hybrid ADC to have different configurations (e.g., different types of ADCs or a different number of active ADCs) to support different communication modes or standards. In this manner, an ADC with a highest resolution and a highest conversion rate may not be used for all communication modes, thereby achieving greater power efficiency. Moreover, a single hybrid ADC can be used to support different communication modes or standards, thereby reducing the number of IP blocks, facilitating IP block reuse, and simplifying analog-digital interface and hardware-software co-design. For example, the use of a single hybrid ADC can avoid many dedicated IP blocks for different communication modes.

In some embodiments, a reconfigurable ADC may include an ADC of a first type in a first stage, a plurality of ADCs of a second type in a second stage, a plurality of first switches electrically coupled between the ADC of the first type and the plurality of ADCs of the second type, a plurality of second switches respectively electrically coupled to the plurality of ADCs of the second type, a circuit configured to perform alignment and correction (e.g., alignment and correction circuit) and/or a controller. The ADC of the first type may receive a first analog signal and convert the first analog signal to a first digital signal as most significant bits (MSBs). The first ADC may output, based on the first analog signal and the first digital signal, a second analog signal to the plurality of first switches. The plurality of first switches may select one or more ADCs of the second type, and provide the second analog signal to the selected one or more ADCs of the second type. The selected one or more ADCs may convert the second analog signal to one or more digital signals as least significant bits (LSBs). The alignment and correction circuit may receive, as an uncorrected output digital signal, the first digital signal and the one or more digital signals (as LSBs), perform alignment and/or correction of the uncorrected output digital signal, and output a corrected output digital signal. The controller may be any circuit, hardware, or processor (e.g., microprocessor) that can control the ADC of the first type and/or each of the plurality of ADCs of the second type to be separately and/or individually turned on or off (or powered on or off). The controller may be any circuit, hardware, or processor (e.g., microprocessor) that can control each of the plurality of the first switches and/or each of the plurality of the second switches to be turned on or off, or to be connected (closed) or disconnected (opened). In some embodiments, the controller may control the ADC of the first type and/or each of the plurality of ADCs of the second type to process only a portion (e.g., 8 bits) of a maximum bits (e.g., 11 bits) supported by the ADC. In some embodiments, the controller may receive an input signal indicating a desired (or target) resolution of an output of a hybrid ADC, and/or an input signal indicating a desired (or target) speed (or conversion rate or sampling rate) of the hybrid ADC. The controller may generate, based on the input signals, one or more control signals to control at least one of the ADC of the first type, each of the plurality of ADCs of the second type, each of the plurality of the first switches, or each of the plurality of the second switches.

In some embodiments, the plurality of second switches may select one or more ADCs of the second type, and provide the first analog signal to the selected one or more ADCs of the second type. The selected one or more ADCs may convert the first analog signal to one or more digital signals as least significant bits. The alignment and correction circuit may receive, as an uncorrected output digital signal, the one or more digital signals, perform alignment and/or correction of the uncorrected output digital signal, and output a corrected output digital signal.

In some embodiments, the ADC of the first type may be one or more flash ADCs, one or more pipelined ADCs (e.g., a pipelined ADC including a multiplying digital-to-analog converter (MDAC)), one or more SAR ADCs, or any circuit, hardware, microprocessor that can convert an analog signal to a digital signal. Similarly, the ADC of the second type may include one or more flash ADCs, one or more pipelined ADCs (e.g., a pipelined ADC including a MDAC), one or more SAR ADCs, or any circuit, hardware, microprocessor that can convert an analog signal to a digital signal. The first type of ADC may be a different type of ADC from the second type of ADC. The alignment and correction circuit may be any circuit or hardware or microprocessor that can perform alignment and/or correction of an output signal of an ADC. For example, the alignment and correction circuit may perform a timing alignment, and a bit alignment and correction. For timing alignment, digital bits from different stages may be aligned in the same clock cycle. For a bit alignment and correction, right alignment of an output (digital) signal of an ADC such that an LSB of a register and an LSB of the output signal are aligned, or may perform left alignment of the output signal such that an MSB of the register and an MSB of the output signal are aligned. The alignment and correction circuit may perform correction of an output (digital) signal of an ADC to correct an error of the output signal (e.g., quantization error, offset error, gain error, and non-linearity, etc.).

In some embodiments, the ADC of the first type in the first stage may be a pipelined ADC including an MDAC (e.g., a ping-pong type MDAC) and a coarse ADC (e.g., ADC configured to generate coarse bits such as MSBs). The MDAC may include a DAC, a sample-and-hold (S/H) circuit, a subtractor circuit, and/or an amplifier with a gain (e.g., gain K). The coarse ADC may be a flash ADC or any circuit or hardware that can convert an analog signal to a digital signal. The DAC may be any circuit or hardware that can convert a digital signal to an analog signal. In some embodiments, a ping-pong type MDAC may include a S/H circuit configured to perform a double sampling, for example, a ping-pong sampling such that sampling for one sampled input signal occurs during a hold phase for another sampled input signal. For example, assuming that the number of MSBs is three (e.g., 3-bit MSBs), the S/H circuit may sample and hold the first analog signal steady, while the coarse ADC quantizes the first analog signal to three bits. The 3-bit output signal may be provided as the first digital signal (MSBs) to the alignment and correction circuit. The 3-bit output signal may be then provided to the DAC which converts the 3-bit output signal to an analog output signal. The subtractor circuit may subtract the analog output signal from the first analog signal to generate a residue signal (e.g., analog residue signal). The amplifier may gain up the residue signal by a factor of "K" and provide the gained-up residue signal (as the second analog signal) to the second stage (e.g., to the plurality of first switches).

In some embodiments, the plurality of ADCs of the second type in the second stage may be time-interleaved SAR ADCs. The ADC of the first type in the first stage and each SAR ADC in the second stage can be selectively activated or used or turned on (via the plurality of first switches and/or the plurality of second switches) based on different requirements of ADC resolution and/or speed (e.g., conversion rate or sampling rate). For example, the plurality of first switches can be powered on or off separately and/or individually to select one or more ADCs of the second type, and provide the second analog signal to the selected one or more ADCs of the second type. In some embodiments, the plurality of second switches may can be turned on or off separately and/or individually to select one or more ADCs of the second type, and provide the first analog signal to the selected one or more ADCs of the second type. In this manner, the hybrid ADC can be configured (or reconfigured) as different architectures (e.g., in terms of resolution and/or speed) to satisfy multiple communication standards while achieving greater power efficiency.

For example, assume that the ADC of the first type in the first stage is a pipeline ADC including a ping-pong type MDAC configured to process 3 bit data (referred to as "ping-pong type 2.5 bit MDAC" because the LSB in the 3 bit data is aligned with the MSB in 11 bit data), and each of the ADCs of the second type (for a respective lane) in the second stage is a SAR ADC configured to process 11 bit data (referred to as "a lane of 11 bit SAR ADC"). The hybrid ADC can be configured (or reconfigured) as the following examples.

Example 1: For a 10 Gigabit Ethernet mode, the hybrid ADC can be configured as an ADC supporting the resolution of 13 bit data and the speed of 800 MHz by (1) turning on the ping-pong type 2.5 bit MDAC and (2) turning on 2 lanes of 11 bit SAR ADCs.

Example 2: For a 5 Gigabit Ethernet mode, the hybrid ADC can be configured as an ADC supporting the resolution of 11 bit data and the speed of 800 MHz by (1) turning off the ping-pong type 2.5 bit MDAC and (2) turning on 2 lanes of 11 bit SAR ADCs.

Example 3: For a 2.5 Gigabit Ethernet mode, the hybrid ADC can be configured as an ADC supporting the resolution of 11 bit data and the speed of 400 MHz by (1) turning off the ping-pong type 2.5 bit MDAC and (2) turning on 1 lane of 11 bit SAR ADC.

Example 4: For a 1 Gigabit Ethernet mode, the hybrid ADC can be configured as an ADC supporting the resolution of 8 bit data and the speed of 125 MHz by (1) turning off the ping-pong type 2.5 bit MDAC, (2) turning on 1 lane of 11 bit SAR ADC, and (3) (re-)configuring the SAR ADC as 8 bit SAR ADC by disabling 3 bits out of 11 bits (so that the SAR ADC can use only 8 bits and stop using the remaining 3 bits).

Examples 1-4 show that the hybrid ADC can be configured (or reconfigured) according to a desired or target resolution and a desired or target speed. As shown in Example 2, in some embodiments, responsive to receiving an input signal indicating a target resolution (e.g., 11 bits) that is below a threshold (e.g., 12 bits, or 10 bits effective number of bits (ENOB)), the controller may generate control signals to control the plurality of first switches to be turned off (or opened). Responsive to receiving an input signal indicating a target speed (e.g., 800 MHz), the controller may generate control signals to select and turn on two switches, from among the plurality of second switches so that 2 lanes of 11 bit SAR ADCs can be turned on.

As shown in Example 3, in some embodiments, responsive to receiving an input signal indicating a target resolution (e.g., 11 bits) that is below a threshold (e.g., 12 bits, or 10 bits ENOB), the controller may generate control signals to control the plurality of first switches to be turned off (or opened). Responsive to receiving an input signal indicating a target speed (e.g., 400 MHz), the controller may generate control signals to select and turn on one switch, from among the plurality of second switches so that 1 lane of 11 bit SAR ADC can be turned on or used. The controller may generate control signals such that the more a target speed is, the more lanes (or SAR ADCs) is turned on or used, or such that there are a linear relationship between the target speed and the number of lanes.

As shown in Example 4, in some embodiments, responsive to receiving an input signal indicating a target resolution (e.g., 8 bits) that is below a threshold (e.g., 12 bits, or 10 bits ENOB), the controller may generate control signals to control the plurality of first switches to be turned off (or opened). Responsive to receiving an input signal indicating a target speed (e.g., 125 MHz), the controller may generate control signals to select and turn on one switch, from among the plurality of second switches so that 1 lane of 11 bit SAR ADC can be turned on or used. Responsive to determining that the target resolution (e.g., 8 bits) is less than a maximum resolution (e.g., 11 bits) supported by each of the plurality of ADCs of the second type (e.g., SAR ADCs), the controller may generate one or more control signals to disable 3 bits out of 11 bits of the SAR ADC (so that the SAR ADC can use only 8 bits and stop using the remaining 3 bits).

SAR ADCs usually have great power efficiency, but provide a moderate resolution (<=10 bit ENOB) due to device matching limits without extra trimming. To support a higher speed (e.g., conversion rate or sampling rate), SAR ADCs may use more time-interleaving channels, which implies more complex layout and digital correction. Meanwhile, a pipelined ADC (e.g., ADC including a ping-pong type MDAC) can achieve a high resolution (>10 bit ENOB) with a high speed, while having moderate power efficiency. The use of the pipelined ADC can minimize time-interleaving channels for simplifying layout and digital correction for a higher speed. As shown in Examples 1-4, the hybrid ADC can be configured as different flavors to meet different requirements of ADC resolution and speed by powering on or off an ADC in the first stage (through the plurality of second switches) or each SAR ADC in the second stage (through the plurality of second switches) to achieve greater power efficiency. This hybrid ADC also can minimize time-interleaving channels or lanes.

In some embodiments, the plurality of first switches and the plurality of second switches may include a plurality of T-switches or multiplexers to achieve a good lane-to-lane isolation. In some embodiments, each multiplexer may have two inputs that are configured to receive the first analog signal and the second analog signal, respectively. Each multiplexer may selectively output the first analog signal or the second analog signal according to an selection signal. For example, in response to receiving a selection signal indicating a first value (e.g., "0"), one or more multiplexers (among the plurality of multiplexers) may be selected to provide the second analog signal to the corresponding one or more ADCs of the second type. On the other hand, in response to receiving a selection signal indicating a second value (e.g., "1"), one or more multiplexers (among the plurality of multiplexers) may be selected to provide the first analog signal to the corresponding one or more ADCs of the second type.

In some embodiments, a reconfigurable multi-channel ADC may include a plurality of hybrid ADCs in corresponding channels, a circuit configured to perform alignment and correction (e.g., alignment and correction circuit) and/or a controller. Each hybrid ADC may include an ADC of a first type in a second stage, a plurality of ADCs of a second type in a third stage, a plurality of switches electrically coupled between the ADC of the first type and the plurality of ADCs of the second type, or respectively electrically coupled to the plurality of ADCs of the second type. Each hybrid ADC may further include an ADC of a third type in a first stage, and a third switch electrically coupled to the ADC of the first type.

Each hybrid ADC may receive a first analog signal and selectively provide the first analog signal (1) to the ADC of the third type in the first stage or (2) to the ADC of the first type in the second stage through the third switch. In response to receiving the first analog signal, the ADC of the third type in the first stage may convert the first analog signal to a first digital signal (e.g., 2 bit digital signal), and output, based on the first analog signal and the first digital signal, a second analog signal (residue signal) and the first digital signal to the ADC of the first type in the second stage. In response to receiving the second analog signal and the first digital signal, the ADC of the first type in the second stage may convert the second analog signal to a second digital signal (e.g., 3 bit digital signal) and combine the first digital signal and the second digital signal (e.g., excluding an overlapping bit) to output an MSB output digital signal of the hybrid ADC (e.g., 4 bit digital signal). The ADC of the first type in the second stage may output, based on the second analog signal and the second digital signal, a third analog signal (residue signal) to one or more ADCs selected from among the plurality of ADCs of the second type in the third stage. The selected one or more ADCs may convert the third analog signal to one or more digital signals as an LSB output digital signal of the hybrid ADC.

In response to receiving the first analog signal by the ADC of the first type in the second stage, the ADC of the first type in the second stage and the plurality of ADCs of the second type in the third stage can generate an MSB output digital signal and an LSB output digital signal of the hybrid ADC in a manner similar to a two-stage hybrid ADC as described above. The alignment and correction circuit may receive, as an uncorrected output digital signal from each hybrid ADC, the MSB output digital signal and the LSB output digital signal, perform alignment and/or correction of the uncorrected output digital signal, and output a corrected output digital signal.

The controller may be any circuit, hardware, or processor (e.g., microprocessor) that can control the ADC of the third type (in the first stage), the ADC of the first type (in the second stage), each of the plurality of ADCs of the second type (in the third stage) to be separately and/or individually turned on or off (or powered on or off). The controller may be any circuit, hardware, or processor (e.g., microprocessor) that can control each of the plurality of the first switches, each of the plurality of the second switches, and/or each third switch to be turned on or off, or to be connected (closed) or disconnected (opened). In some embodiments, the controller may control the ADC of the first type, each of the plurality of ADCs of the second type, and/or the ADC of the third type to use or process only a portion (e.g., 8 bits) of a maximum bits (e.g., 11 bits) supported by the ADC. In some embodiments, the controller may receive an input signal indicating a desired (or target) resolution of an output of a hybrid ADC, and/or an input signal indicating a desired (or target) speed (or conversion rate or sampling rate) of the hybrid ADC. The controller may generate, based on the input signals, one or more control signals to control at least one of the ADC of the first type, each of the plurality of ADCs of the second type, the ADC of the third type, each of the plurality of the first switches, each of the plurality of the second switches, or each third switch.

In some embodiments, the ADC of the third type may be one or more flash ADCs, one or more pipelined ADCs (e.g., a pipelined ADC including a multiplying digital-to-analog converter (MDAC)), one or more SAR ADCs, or any circuit, hardware, microprocessor that can convert an analog signal to a digital signal. The third type of ADC may be the same as the first type of ADC. The third type of ADC may be different from the second type of ADC.

In some embodiments, the reconfigurable multi-channel ADC may include ADCs in three stages—first, second and third stages. For example, the ADC of the third type may function as an ADC in the first stage, the ADC of the first type may function as an ADC the a second stage, and the plurality of ADCs of the second type may function as ADCs in the third stage, If the ADCs in that first and second stage are pipelined ADCs including a ping-pong type MDAC, and the ADCs in the third stage are SAR ADCs, the reconfigurable multi-channel ADC can increase the speed of analog-to-digital conversion by increasing the number of channels. The reconfigurable multi-channel ADC can increase the resolution or accuracy of analog-to-digital conversion by turning on one or more ADCs in the third stage For higher speed (or higher sampling rate) applications, the reconfigurable multi-channel ADC can (1) increase the number of lanes in the third stage, or (2) increase the number of channels. In some embodiments, the reconfigurable multi-channel ADC may first increase the number of SAR ADC lanes in the third stage, determine whether the speed of the conversion satisfies a target speed, and responsive to determining that the speed of the conversion does not satisfy the target speed, increase the number of channels. The reconfigurable multi-channel ADC may first increase the number of lanes in the third stage and then increase the number of channels to satisfy the target speed, because SAR ADCs have great power efficiency and the ADCs in the first stage and the second stage (e.g., pipelined ADCs) are less time-interleaving between channels. For higher ADC resolution applications, the reconfigurable multi-channel ADC can configure the first stage to process higher bits (usually <=4 bit) or add more stages (e.g., the second stage). Meanwhile, each of the first stage, the second stage, and the third stage (e.g., SAR ADCs) can be powered on or off separately and/or individually based on the different requirements of ADC resolution and speed. As a result, the reconfigurable multi-channel ADC can be configured as different architectures to satisfy multi-standard communication with greater power efficiency.

Embodiments in the present disclosure have at least the following advantages and benefits. First, embodiments in the present disclosure can provide useful techniques for reconfiguring a hybrid ADC to have different configurations (e.g., different types of ADCs or a different number of active ADCs) to support different communication modes or standards with great power efficiency. In this manner, an ADC with a highest resolution and a highest conversion rate may not be used for all communication modes, thereby achieving greater power efficiency. A reconfigurable hybrid ADC can achieve different ADC resolutions and different sampling rates while maintaining great power efficiency.

Second, embodiments in the present disclosure can provide useful techniques for a single hybrid ADC to support different communication modes or standards, thereby reducing the number of IP blocks, facilitating IP block reuse, and simplifying analog-digital interface and hardware-software co-design. For example, the use of a single hybrid ADC can avoid many dedicated IP blocks for different communication modes.

Third, embodiments in the present disclosure can provide useful techniques for implementing a multi-standard communication system or any products that can be more versatile in communication standards or modes, reduce the number of IP blocks, facilitate IP block reuse, and/or simplify analog-digital interface and hardware-software co-design.

FIG. 1 is a schematic block diagram of a reconfigurable hybrid ADC 1000 including different types of ADCs, in accordance with an embodiment. The reconfigurable ADC 1000 may include an ADC of a first type 110-1 in a first stage 110, a plurality of ADCs of a second type 120-0, . . . , 120-n in a second stage 120, a plurality of first switches (S0a, . . . , Sna) 121-0, . . . , 121-n electrically coupled between the ADC of the first type 110-1 and the plurality of ADCs of the second type 120-0, . . . , 120-n, a plurality of second switches (S0b, . . . , Snb) 122-0, . . . , 122-n, respectively electrically coupled to the plurality of ADCs of the second type 120-0, . . . , 120-n, a circuit configured to perform alignment and correction (e.g., alignment and correction circuit 150) and/or a controller 190.

Referring to FIG. 1, the ADC of the first type 110-1 may receive a first analog signal 101 and convert the first analog signal 101 to a first digital signal 141 as most significant bits (MSBs). The first ADC 110-1 may output, based on the first analog signal 101 and the first digital signal 141, a second analog signal (e.g., residue signal) 103 to the plurality of first switches 121-0, . . . , 121-n. The plurality of first switches 121-0, . . . , 121-n may select one or more ADCs of the second type (e.g., two ADCs 120-0 and ADC 120-1), and provide the second analog signal 103 to the selected one or more ADCs of the second type. The selected one or more ADCs 120-0, 120-1 may convert the second analog signal 103 to one or more digital signals (LSBs0 and LSBs1) 142-0, 142-1 (out of LSBs0 (142-0), . . . , LSBsn (142-n)) as least significant bits (LSBs). The alignment and correction circuit 150 may receive, as an uncorrected output digital signal, the first digital signal 141 and the one or more digital signals (as LSBs) 142-0, 142-1, perform alignment and/or correction of the uncorrected output digital signal, and output a corrected output digital signal (Dout) 160.

Referring to FIG. 1, the plurality of second switches 122-0, . . . , 122-n may select one or more ADCs of the second type (e.g., two ADCs 120-0 and ADC 120-1), and provide the first analog signal 101 to the selected one or more ADCs of the second type. The selected one or more ADCs 120-0, 120-1 may convert the first analog signal 101 to one or more digital signals (LSBs0 and LSBs1) 142-0, 142-1. The alignment and correction circuit 150 may receive, as an uncorrected output digital signal, the one or more digital signals 142-0, 142-1, perform alignment and/or correction of the uncorrected output digital signal, and output a corrected output digital signal 160.

Referring to FIG. 1, the controller 190 may be any circuit, hardware, or processor (e.g., microprocessor) that can control the ADC of the first type 110-1 and/or each of the plurality of ADCs of the second type 120-0, . . . , 120-n to be separately and/or individually turned on or off (or powered on or off), and can control each of the plurality of the first switches 121-0, . . . , 121-n and/or each of the plurality of the second switches 122-0, . . . , 122-n to be turned on or off, or to be connected (closed) or disconnected (opened). The controller 190 may control the ADC of the first type and/or each of the plurality of ADCs of the second type to use or process only a portion (e.g., 8 bits) of a maximum bits (e.g., 11 bits) supported by the ADC. The controller 190 may receive an input signal (Res-sig) 191 indicating a desired (or target) resolution of an output of the hybrid ADC 1000, and/or an input signal (Spe_sig) 192 indicating a desired (or target) speed (or conversion rate or sampling rate) of the hybrid ADC 1000. The controller 190 may generate, based on the input signals 191, 192, one or more control signals 195 to control at least one of the ADC of the first type 110-1, each of the plurality of ADCs of the second type 120-0, ..., 120-*n*, each of the plurality of the first switches 121-0, ..., 121-*n*, and/or each of the plurality of the second switches 122-0, ..., 122-*n*.

Referring to FIG. 1, the ADC of the first type 110-1 may be one or more flash ADCs, one or more pipelined ADCs (e.g., a pipelined ADC including a multiplying digital-to-analog converter (MDAC)), one or more SAR ADCs, or any circuit, hardware, microprocessor that can convert an analog signal to a digital signal. Similarly, the ADC of the second type 120-0, ..., or 120-*n* may include one or more flash ADCs, one or more pipelined ADCs (e.g., a pipelined ADC including a MDAC), one or more SAR ADCs, or any circuit, hardware, microprocessor that can convert an analog signal to a digital signal. The first type of ADC may be different from the second type of ADC.

Referring to FIG. 1, the alignment and correction circuit 150 may be any circuit or hardware or microprocessor that can perform alignment and/or correction of an output signal of an ADC. For example, the alignment and correction circuit may perform right alignment of an output (digital) signal of an ADC such that an LSB of a register (not shown) and an LSB of the output signal are aligned, or may perform left alignment of the output signal such that an MSB of the register and an MSB of the output signal are aligned. The alignment and correction circuit 150 may perform correction of an output (digital) signal of an ADC to correct an error of the output signal (e.g., quantization error, offset error, gain error, and non-linearity, etc.).

Figure 2:
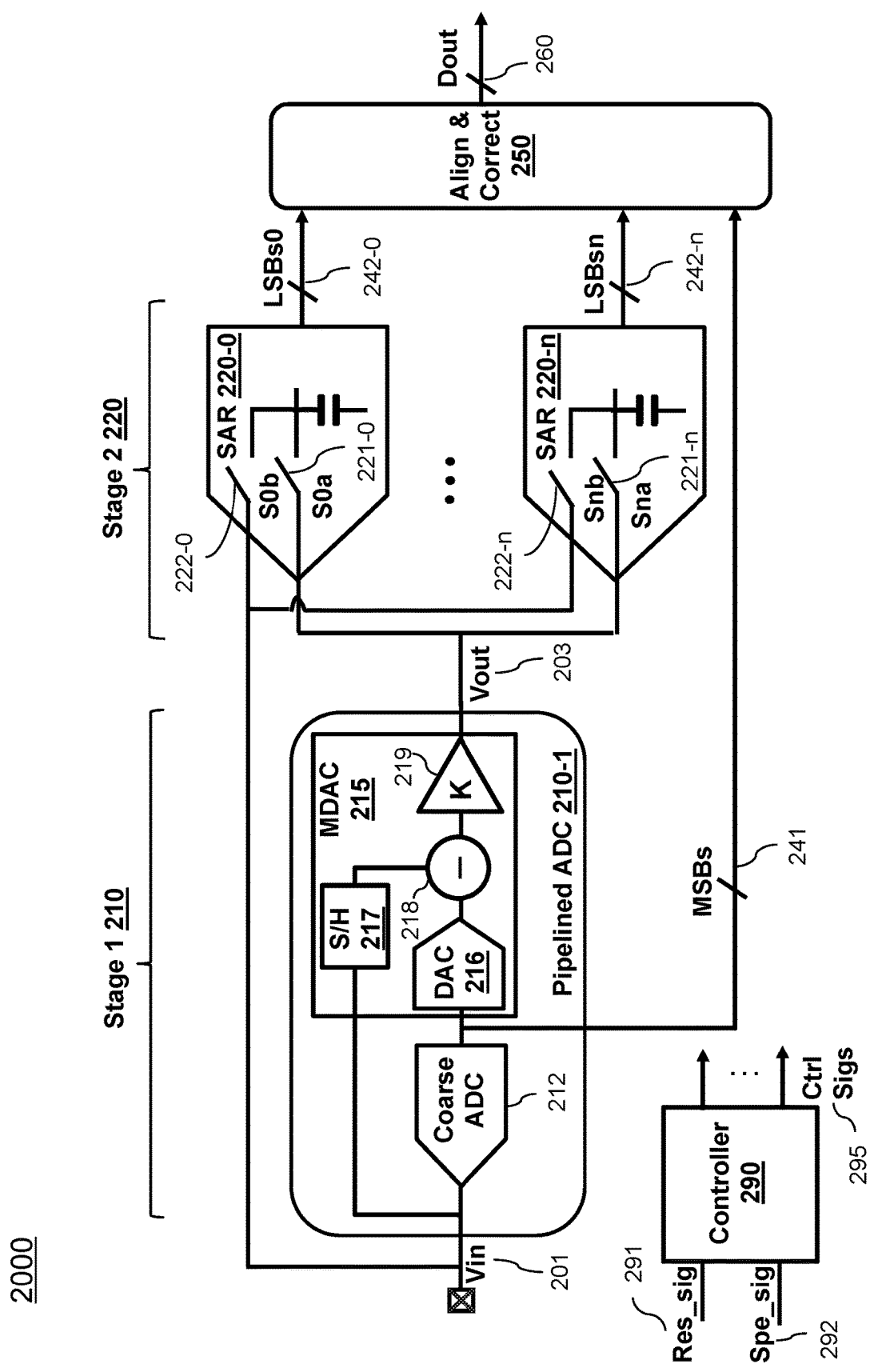
FIG. 2 is a schematic block diagram of an example reconfigurable hybrid ADC including a pipelined ADC and successive approximation register (SAR) ADCs, in accordance with an embodiment.

FIG. 2 is a schematic block diagram of an example reconfigurable hybrid ADC 2000 including a pipelined ADC and successive approximation register (SAR) ADCs, in accordance with an embodiment. The reconfigurable hybrid ADC 2000 may have configuration similar to that of the reconfigurable hybrid ADC 1000. For example, the reconfigurable ADC 2000 may include an ADC of a first type 210-1 in a first stage 210, a plurality of ADCs of a second type 220-0, ..., 220-*n* in a second stage 120, a plurality of first switches (S0*a*, ..., Sn*a*) 221-0, ..., 221-*n* (collectively first switches 221) electrically coupled between the ADC of the first type 210-1 and the plurality of ADCs of the second type 220-0, ..., 220-*n*, a plurality of second switches (S0*b*, ..., Sn*b*) 222-0, ..., 222-*n* (collectively second switches 222), respectively electrically coupled to the plurality of ADCs of the second type 220-0, ..., 220-*n*, a circuit configured to perform alignment and correction (e.g., alignment and correction circuit 250) and/or a controller 290.

Referring to FIG. 2, the ADC of the first type 210-1 may receive a first analog signal 201 and convert the first analog signal 201 to a first digital signal 241 as MSBs. The first ADC 210-1 may output, based on the first analog signal 201 and the first digital signal 241, a second analog signal (e.g., residue signal) 203 to the plurality of first switches 221-0, ..., 221-*n*. The plurality of first switches 221-0, ..., 221-*n* may select one or more ADCs of the second type (e.g., two ADCs 220-0 and ADC 220-1), and provide the second analog signal 203 to the selected one or more ADCs of the second type. The selected one or more ADCs 220-0, 220-1 may convert the second analog signal 203 to one or more digital signals (LSBs0 and LSBs1) 242-0, 242-1 (out of LSBs0 (242-0), ..., LSBsn (242-*n*)) as LSBs. The alignment and correction circuit 250 may receive, as an uncorrected output digital signal, the first digital signal 241 and the one or more digital signals (as LSBs) 242-0, 242-1, perform alignment and/or correction of the uncorrected output digital signal, and output a corrected output digital signal (Dout) 260. The plurality of second switches 222-0, ..., 222-*n* may select one or more ADCs of the second type (e.g., two ADCs 220-0 and ADC 220-1), and provide the first analog signal 201 to the selected one or more ADCs of the second type. The selected one or more ADCs 220-0, 220-1 may convert the first analog signal 201 to one or more digital signals (LSBs0 and LSBs1) 242-0, 242-1. The alignment and correction circuit 250 may receive, as an uncorrected output digital signal, the one or more digital signals 242-0, 242-1, perform alignment and/or correction of the uncorrected output digital signal, and output a corrected output digital signal 260. The controller 190 may generate, based on the input signals 291, 292, one or more control signals 295 to control at least one of the ADC of the first type 210-1, each of the plurality of ADCs of the second type 220-0, ..., 220-*n*, each of the plurality of the first switches 221-0, ..., 221-*n*, and/or each of the plurality of the second switches 222-0, ..., 222-*n*.

Referring to FIG. 2, the ADC of the first type in the first stage 210 may be a pipelined ADC 210-1 including an MDAC (e.g., a ping-pong type MDAC 215) and a coarse ADC 212. The MDAC 215 may include a DAC 216, a sample-and-hold (S/H) circuit 217, a subtractor circuit 218, and/or an amplifier 219 with a gain (e.g., gain K). The coarse ADC 212 may be a flash ADC or any circuit or hardware that can convert an analog signal to a digital signal. The DAC 216 may be any circuit or hardware that can convert a digital signal to an analog signal. In some embodiments, the ping-pong type MDAC 215 may include a S/H circuit 217 configured to perform a double sampling, for example, a ping-pong sampling such that sampling for one sampled input signal occurs during a hold phase for another sampled input signal. For example, assuming that the number of MSBs is three (e.g., 3-bit MSBs), the S/H circuit 217 may sample and hold the first analog signal 201 steady, while the coarse ADC 212 quantizes the first analog signal 201 to three bits. The 3-bit output signal may be provided as the first digital signal 241 (MSBs) to the alignment and correction circuit 258. The 3-bit output signal may be then provided to the DAC 216 which converts the 3-bit output signal to an analog output signal. The subtractor circuit 218 may subtract the analog output signal from the first analog signal 201 to generate a residue signal (e.g., analog residue signal). The amplifier may gain up the residue signal by a factor of "K" and provide the gained-up residue signal (as the second analog signal 203) to the second stage 220 (e.g., to the plurality of first switches 221-0, ..., 221-*n*).

Referring to FIG. 2, the plurality of ADCs of the second type 220-0, ..., 220-*n* in the second stage 220 may be time-interleaved SAR ADCs. The ADC of the first type in the first stage 210 and each SAR ADC in the second stage 220 can be selectively activated or used or turned on (via the plurality of first switches 221 and/or the plurality of second switches 222) based on different requirements of ADC resolution and/or speed (e.g., conversion rate or sampling rate). For example, the plurality of first switches 221 can be powered on or off separately and/or individually to select one or more ADCs of the second type (e.g., SAR ADCs 220-0, 220-1), and provide the second analog signal 203 to the selected one or more ADCs of the second type 220-0, 220-1. In some embodiments, the plurality of second switches 222 may can be powered on or off separately and/or individually to select one or more ADCs of the second type (e.g., SAR ADCs 220-0, 220-1), and provide the first analog signal 201 to the selected one or more ADCs of the second type 220-0, 220-1. In this manner, the hybrid ADC 2000 can be configured (or reconfigured) as different architectures (e.g., in terms of resolution and/or speed) to satisfy multiple communication standards while achieving greater power efficiency.

For example, the ADC of the first type in the first stage may be a pipeline ADC 210-1 including a ping-pong type MDAC 215 configured to process 3 bit data (referred to as "ping-pong type 2.5 bit MDAC"), and each of the ADCs of the second type (for a respective lane) in the second stage 220 may be a SAR ADC configured to process 11 bit data (referred to as "a lane of 11 bit SAR ADC"). With this configuration, the hybrid ADC 2000 can be configured (or reconfigured) as the following examples.

Example 1: For a 10 Gigabit Ethernet mode, the hybrid ADC 2000 can be configured as an ADC supporting the resolution of 13 bit data and the speed of 800 MHz by (1) turning on the ping-pong type 2.5 bit MDAC (e.g., turning on the pipelined ADC 210-1) and (2) turning on 2 lanes of 11 bit SAR ADCs (e.g., SAR ADCs 220-0, 220-1).

Example 2: For a 5 Gigabit Ethernet mode, the hybrid ADC 2000 can be configured as an ADC supporting the resolution of 11 bit data and the speed of 800 MHz by (1) turning off the ping-pong type 2.5 bit MDAC (e.g., turning off the pipelined ADC 210-1) and (2) turning on 2 lanes of 11 bit SAR ADCs (e.g., SAR ADCs 220-0, 220-1).

Example 3: For a 2.5 Gigabit Ethernet mode, the hybrid ADC 2000 can be configured as an ADC supporting the resolution of 11 bit data and the speed of 400 MHz by (1) turning off the ping-pong type 2.5 bit MDAC (e.g., turning off the pipelined ADC 210-1) and (2) turning on 1 lane of 11 bit SAR ADC (e.g., SAR ADC 220-0).

Example 4: For a 1 Gigabit Ethernet mode, the hybrid ADC 2000 can be configured as an ADC supporting the resolution of 8 bit data and the speed of 125 MHz by (1) turning off the ping-pong type 2.5 bit MDAC (e.g., turning off the pipelined ADC 210-1), (2) turning on 1 lane of 11 bit SAR ADC (e.g., SAR ADC 220-0), and (3) (re-)configuring the SAR ADC 220-0 as 8 bit SAR ADC by disabling 3 bits out of 11 bits so that the SAR ADC 220-0 can use only 8 bits and stop using the remaining 3 bits.

Examples 1-4 show that the hybrid ADC 2000 can be configured (or reconfigured) according to a desired or target resolution and a desired or target speed. As shown in Example 2, responsive to receiving an input signal (e.g., signal 291) indicating a target resolution (e.g., 11 bits) that is below a threshold (e.g., 12 bits, or 10 bits ENOB), the controller 290 may generate control signals 295 to control the plurality of first switches 221 to be turned off (or opened) so that the ADC 210-1 is not used. Responsive to receiving an input signal (e.g., signal 292) indicating a target speed (e.g., 800 MHz), the controller 290 may generate control signals 295 to select and turn on two switches (e.g., 222-0, 222-1), from among the plurality of second switches 222 so that 2 lanes of 11 bit SAR ADCs (e.g., SAR ADCs 220-0, 220-1) can be turned on.

As shown in Example 3, responsive to receiving an input signal 291 indicating a target resolution (e.g., 11 bits) that is below a threshold (e.g., 12 bits, or 10 bits ENOB), the controller 290 may generate control signals 295 to control the plurality of first switches 221 to be turned off (or opened) so that the ADC 210-1 is not used. Responsive to receiving an input signal 292 indicating a target speed (e.g., 400 MHz), the controller 290 may generate control signals 295 to select and turn on one switch (e.g., 222-0), from among the plurality of second switches 222 so that 1 lane of 11 bit SAR ADC (e.g., SAR ADC 220-0) can be turned on or used. The controller 290 may generate control signals 295 such that the more a target speed is, the more lanes (or SAR ADCs) are turned on or used, or such that there are a linear relationship between the target speed and the number of lanes.

As shown in Example 4, in some embodiments, responsive to receiving an input signal 291 indicating a target resolution (e.g., 8 bits) that is below a threshold (e.g., 12 bits, or 10 bits ENOB), the controller 290 may generate control signals 295 to control the plurality of first switches to be turned off (or opened) so that the ADC 210-1 is not used. Responsive to receiving an input signal 292 indicating a target speed (e.g., 125 MHz), the controller 290 may generate control signals 295 to select and turn on one switch (e.g., 220-0), from among the plurality of second switches 222 so that 1 lane of 11 bit SAR ADC (e.g., SAR ADC 220-0) can be turned on or used. Responsive to determining that the target resolution (e.g., 8 bits) is less than a maximum resolution (e.g., 11 bits) supported by each of the plurality of ADCs of the second type (e.g., SAR ADC 220-0), the controller 290 may generate one or more control signals 295 to disable 3 bits out of 11 bits of the SAR ADC 220-0 so that the SAR ADC 220-0 can use only 8 bits and stop using the remaining 3 bits.

Figure 3:
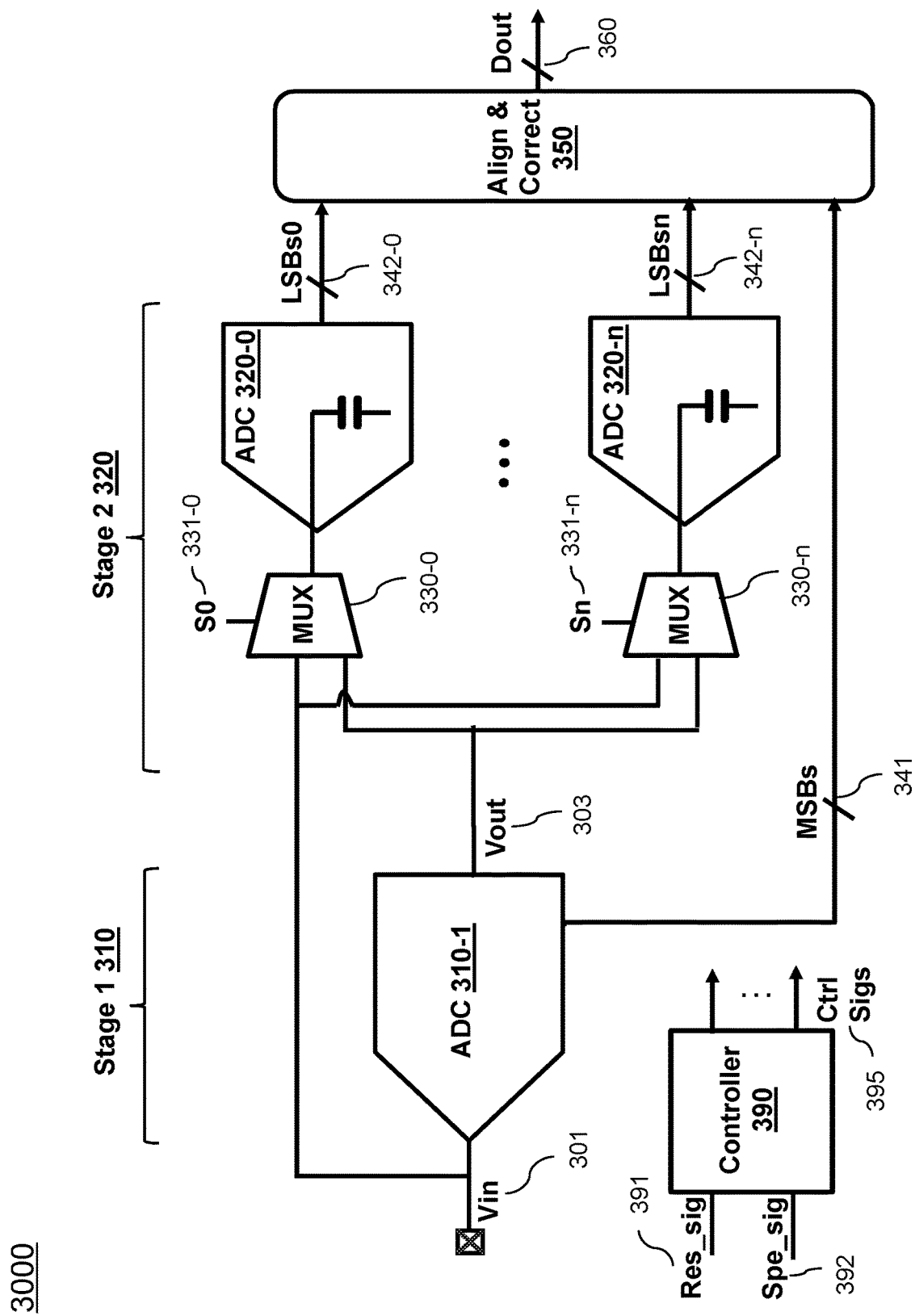
FIG. 3 is a schematic block diagram of reconfiguring a hybrid ADC including different types of ADCs using a plurality of multiplexers, in accordance with an embodiment.

FIG. 3 is a schematic block diagram of reconfiguring a hybrid ADC 3000 including different types of ADCs using a plurality of multiplexers, in accordance with an embodiment. The reconfigurable hybrid ADC 3000 may have configuration similar to that of the reconfigurable hybrid ADC 1000 or 2000 except for the plurality of first switches and the plurality of second switches. For example, the reconfigurable ADC 3000 may include an ADC of a first type 310-1 in a first stage 310, a plurality of ADCs of a second type 320-0, . . . , 320-*n* in a second stage 320, a plurality of T-switches or multiplexers 330-0, . . . , 330-*n* (the plurality of multiplexer 330 collectively) electrically coupled between the ADC of the first type 310-1 and the plurality of ADCs of the second type 320-0, . . . , 320-*n*, a circuit configured to perform alignment and correction (e.g., alignment and correction circuit 350) and/or a controller 390.

Referring to FIG. 3, the reconfigurable hybrid ADC 3000 may include the plurality of T-switches as multiplexers 330 to achieve a good lane-to-lane isolation. Each multiplexer 330-0, . . . , 330-*n* may be have two inputs that are configured to receive the first analog signal 301 and the second analog signal 303, respectively. Each multiplexer 330-0, . . . , 330-*n* may receive a selection signal 331-0, . . . , 331-*n*. Each multiplexer may selectively output the first analog signal 301 or the second analog signal 303 according to the selection signal 331-0, . . . , 331-*n*. For example, in response to receiving a selection signal indicating a first value (e.g., "0"), one or more multiplexers (e.g., multiplexers 330-0, 330-1 among the plurality of multiplexers) may be selected to provide the second analog signal 303 to the corresponding one or more ADCs of the second type (e.g., ADCs 320-0, 320-1). On the other hand, in response to receiving a selection signal indicating a second value (e.g., "1"), one or more multiplexers (e.g., multiplexers 330-0, 330-1 among the plurality of multiplexers) may be selected to provide the first analog signal 301 to the corresponding one or more ADCs of the second type (e.g., ADCs 320-0, 320-1).

Referring to FIG. 3, the ADC of the first type 310-1 may receive a first analog signal 301 and convert the first analog signal 301 to a first digital signal 341 as MSBs. The first ADC 310-1 may output, based on the first analog signal 301 and the first digital signal 341, a second analog signal (e.g., residue signal) 303 to the plurality of multiplexer 330. The plurality of multiplexer 330 may select one or more ADCs of the second type (e.g., two ADCs 320-0 and ADC 320-1) according to a selection signal 331 indicating the first value ("0"), and provide the second analog signal 303 to the selected one or more ADCs of the second type. The selected one or more ADCs 320-0, 320-1 may convert the second analog signal 303 to one or more digital signals (LSBs0 and LSBs1) 342-0, 342-1 (out of LSBs0 (342-0), . . . , LSBsn (342-n)) as LSBs. The alignment and correction circuit 350 may receive, as an uncorrected output digital signal, the first digital signal 341 and the one or more digital signals (as LSBs) 342-0, 342-1, perform alignment and/or correction of the uncorrected output digital signal, and output a corrected output digital signal (Dout) 360. The plurality of multiplexer 330 may select one or more ADCs of the second type (e.g., two ADCs 320-0 and ADC 320-1) according to a selection signal 331 indicating the second value ("1"), and provide the first analog signal 301 to the selected one or more ADCs of the second type. The selected one or more ADCs 320-0, 320-1 may convert the first analog signal 301 to one or more digital signals (LSBs0 and LSBs1) 342-0, 342-1. The alignment and correction circuit 350 may receive, as an uncorrected output digital signal, the one or more digital signals 342-0, 342-1, perform alignment and/or correction of the uncorrected output digital signal, and output a corrected output digital signal 360. The controller 390 may generate, based on the input signals 391, 392, one or more control signals 395 to control at least one of the ADC of the first type 310-1, each of the plurality of ADCs of the second type 320-0, . . . , 320-n, or each of the plurality of multiplexers 330-0, . . . , 330-n. For example, the one or more control signals 395 may include selection signals 331-0, . . . , 331-n.

Figure 4:
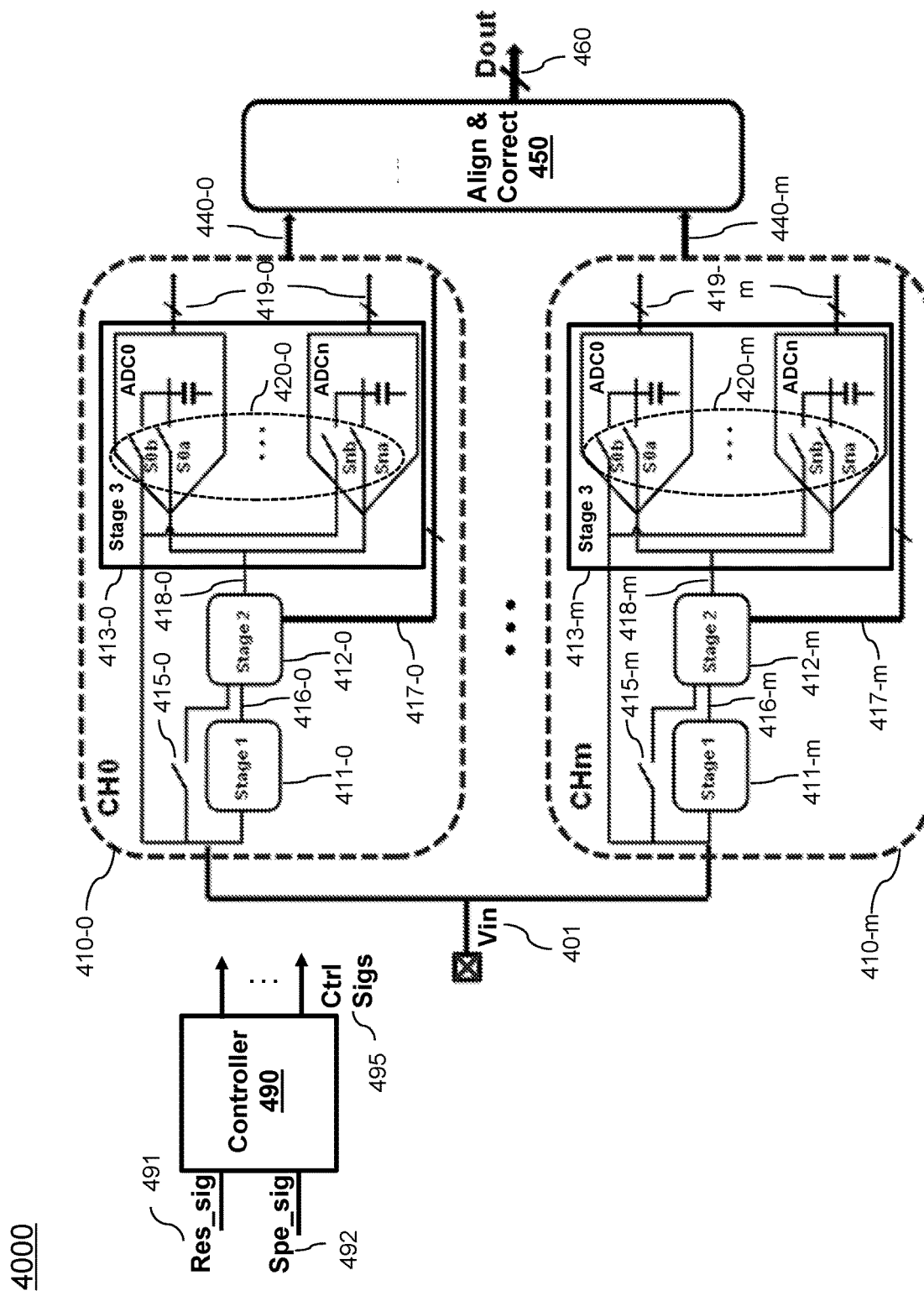
FIG. 4 is a schematic block diagram of a reconfigurable multi-channel ADC, in accordance with an embodiment.

FIG. 4 is a schematic block diagram of a reconfigurable multi-channel ADC 4000, in accordance with an embodiment. The reconfigurable multi-channel ADC 4000 may include a plurality of hybrid ADCs 410-0, . . . , 410-m in corresponding channels CH0, . . . , CHm, a circuit configured to perform alignment and correction (e.g., alignment and correction circuit 450) and/or a controller 490. Each hybrid ADC may include an ADC of a first type in a second stage 412-0, . . . , 412-m (collectively the second stage 412), a plurality of ADCs of a second type (e.g., ADC0, . . . , ADCn) in a third stage 413-0, . . . , 413-m (collectively the third stage 413), a plurality of switches (e.g., first switches S0a, . . . , Sna, and second switches S0b, . . . , Snb) electrically coupled between the ADC of the first type and the plurality of ADCs of the second type, or respectively electrically coupled to the plurality of ADCs of the second type. Each hybrid ADC may further include an ADC of a third type in a first stage 411-0, . . . , 411-m (collectively the first stage 411), and a third switch 415-0, . . . , 415-m electrically coupled to the ADC of the first type. The ADC of the third type may be one or more flash ADCs, one or more pipelined ADCs (e.g., a pipelined ADC including a multiplying digital-to-analog converter (MDAC)), one or more SAR ADCs, or any circuit, hardware, microprocessor that can convert an analog signal to a digital signal. The third type of ADC may be the same as the first type of ADC. The third type of ADC may be different from the second type of ADC.

Referring to FIG. 4, each hybrid ADC 410-0, . . . , 410-m may receive a first analog signal 401 and selectively provide the first analog signal 401 (1) to the ADC of the third type in the first stage 411-0, . . . , 411-m or (2) to the ADC of the first type in the second stage 412-0, . . . , 412-m through the third switch 415-0, . . . , 415-m. In response to receiving the first analog signal 401, the ADC of the third type in the first stage 411-0, . . . , 411-m may convert the first analog signal 401 to a first digital signal (e.g., 2 bit digital signal), and output, based on the first analog signal 401 and the first digital signal, a second analog signal (residue signal) and the first digital signal (e.g., a combined signal 416-0, . . . , 416-m) to the ADC of the first type in the second stage 412-0, . . . , 412-m. In response to receiving the second analog signal and the first digital signal (e.g., the combined signal 416-0, . . . , 416-m), the ADC of the first type in the second stage 412-0, . . . , 412-m may convert the second analog signal to a second digital signal (e.g., 3 bit digital signal) and combine the first digital signal and the second digital signal (e.g., excluding an overlapping bit) to output an MSB output digital signal of the hybrid ADC (e.g., 4 bit digital signal) 417-0, . . . , 417-m. The ADC of the first type in the second stage 412-0, . . . , 412-m may output, based on the second analog signal and the second digital signal, a third analog signal (residue signal) 418-0, . . . , 418-m to one or more ADCs selected from among the plurality of ADCs of the second type in the third stage 413-0, . . . , 413-m. The selected one or more ADCs may convert the third analog signal 418-0, . . . , 418-m to one or more digital signals 419-0, . . . , 419-m as an LSB output digital signal of the hybrid ADC 410-0, . . . , 410-m.

Referring to FIG. 4, in response to receiving the first analog signal 401 by the ADC of the first type in the second stage 412-0, . . . , 412-m, the ADC of the first type in the second stage and the plurality of ADCs of the second type in the third stage 413-0, . . . , 413-m can generate an MSB output digital signal 417-0, . . . , 417-m and an LSB output digital signal 419-0, . . . , 419-m of the hybrid ADC 410-0, . . . , 410-m in a manner similar to the two-stage hybrid ADCs 1000, 2000, 3000 as shown in FIG. 1, FIG. 2, and FIG. 3, respectively. The alignment and correction circuit 450 may receive, as an uncorrected output digital signal 440-0, . . . , 440-m from each hybrid ADC, the MSB output digital signal 417-0, . . . , 417-m and the LSB output digital signal 419-0, . . . , 419-m, perform alignment and/or correction of the uncorrected output digital signal 440-0, . . . , 440-m, and output a corrected output digital signal 460.

Referring to FIG. 4, the controller 490 may be any circuit, hardware, or processor (e.g., microprocessor) that can control the ADC of the third type (in the first stage 411-0, . . . , 411-m), the ADC of the first type (in the second stage 412-0, . . . , 412-m), each of the plurality of ADCs of the second type (in the third stage 413-0, . . . , 413-m) to be separately and/or individually turned on or off (or powered on or off), and can control each of the plurality of the first switches (e.g., switches s0a, . . . , sna), each of the plurality of the second switches (e.g., switches s0b, . . . , snb), and/or each third switch 411-0, . . . , 411-m to be turned on or off, or to be connected (closed) or disconnected (opened). The controller 490 may control the ADC of the first type, each of the plurality of ADCs of the second type, and/or the ADC of the third type to use or process only a portion (e.g., 8 bits) of a maximum bits (e.g., 11 bits) supported by the ADC. In some embodiments, the controller 490 may receive an input signal 491 indicating a desired (or target) resolution of an output of a hybrid ADC, and/or an input signal 492 indicating a desired (or target) speed (or conversion rate or sampling rate) of the hybrid ADC. The controller 490 may generate, based on the input signals, one or more control signals 495 to control at least one of the ADC of the first type, each of the plurality of ADCs of the second type, the ADC of the third type, each of the plurality of the first switches, each of the plurality of the second switches, or each third switch.

Referring to FIG. 4, the ADCs of first and third types are pipelined ADCs including a ping-pong type MDAC (e.g., pipelined ADC 210-1 including ping-pong type MDAC 215 in FIG. 2), and the ADCs of the second type are SAR ADCs (e.g., SAR ADCs 222-0, . . . , 222-n in FIG. 2), the reconfigurable multi-channel ADC 4000 can increase the speed of analog-to-digital conversion by increasing the number of channels (e.g., increasing the number m in FIG. 4). The reconfigurable multi-channel ADC 4000 can increase the resolution or accuracy of analog-to-digital conversion by turning on one or more ADCs of the third type in the first stage 411 in one or more channels. For higher speed (or higher sampling rate) applications, the reconfigurable multi-channel ADC 4000 can (1) increase the number of lanes (e.g., number n in FIG. 4) in the third stage 413, or (2) increase the number of channels (e.g., number m in FIG. 4). The reconfigurable multi-channel ADC 4000 may first increase the number of SAR ADC lanes (e.g., number n in FIG. 4) in the third stage 413, determine whether the speed of the conversion satisfies a target speed, and responsive to determining that the speed of the conversion does not satisfy the target speed, increase the number of channels (e.g., number m). The reconfigurable multi-channel ADC 4000 may first increase the number of lanes (e.g., number n) in the third stage 413 and then increase the number of channels (e.g., number m) if necessary, because SAR ADCs have great power efficiency and the ADCs in the first stage 411 and the second stage 412 (e.g., pipelined ADCs) are less time-interleaving between channels. For higher ADC resolution applications, the reconfigurable multi-channel ADC 4000 can configure the first stage 411 to process higher bits (usually <=4 bit) or add more stages (e.g., the second stage 412). Meanwhile, each of the first stage 411, the second stage 412, and the third stage 413 (e.g., SAR ADCs) can be powered on or off separately and/or individually based on the different requirements of ADC resolution and speed. As a result, the reconfigurable multi-channel ADC 4000 can be configured as different architectures to satisfy multi-standard communication with greater power efficiency.

Referring to FIG. 4, a system (e.g., reconfigurable multi-channel ADC 4000) may include a plurality of analog-to-digital converters (ADCs) of a first type (e.g., ADCs in a second stage 412-0, . . . , 412-m) electrically coupled to a plurality of switches (e.g., switches 420-0, . . . , 420-m), each ADC of the first type (e.g., ADC 412-0) being electrically coupled by a respective switch (e.g., switch 420-0) to a plurality of ADCs of a second type (e.g., ADC0, . . . , ADCn in a third stage 413-0). Each switch may be configured to select, based on a rate of an analog-to-digital conversion (e.g., target rate or speed of the reconfigurable multi-channel ADC 4000), a quantity of ADCs of the second type, from among the plurality of ADCs (e.g., ADC0, . . . , ADCn in the third stage 413-0), to supply the analog-to-digital conversion at the rate. Each switch may be configured to selectively bypass the respective ADC of the first type (e.g., ADC in the second stage 412-0) according to a resolution of the analog-to-digital conversion (e.g., a target resolution of the analog-to-digital conversion). Each switch may be configured to bypass the respective ADC of the first type responsive to the resolution of the conversion being below a first threshold (e.g., ADC in the second stage 412-0 may be bypassed when the target resolution is below the first threshold).

Referring to FIG. 4, each ADC of the first type (e.g., ADC0, ADC1, . . . , ADCn in the third stage 413-0) includes an MDAC (e.g., MDAC 215). In some embodiments, the plurality of ADCs of the second type (e.g., ADC0, . . . , ADCn in the third stage 413-0) may include time-interleaved successive approximation register (SAR) ADCs. In some embodiments, the selected quantity of ADCs of the second type may increase as the rate of the analog-to-digital conversion increases (e.g., the higher the target rate or speed becomes, the more number of ADCs of the second type the corresponding switch or a controller can select to satisfy the target rate or speed).

In some embodiments, each switch (e.g., switch 413-0) may include a plurality of multiplexers (e.g., multiplexers 330-0, . . . , 330-n) respectively electrically coupled to the plurality of ADCs of the second type (e.g., ADC0, . . . , ADCn in the third stage 413-0). Each multiplexer may be configured to selectively bypass the respective ADC of the first type (e.g., ADC in the second stage 412-0) responsive to the resolution of the conversion being below the threshold. In some embodiments, the system may include a plurality of ADCs of a third type (e.g., ADCs in the first stage 411-0, . . . , 411-m) respectively electrically coupled to the plurality of ADCs of the first type (e.g., ADCs in the second stage 412-0, . . . , 412-m), and a plurality of further switches (e.g., switches 415-0, . . . , 415-m) respectively electrically coupled to the plurality of ADCs of the third type (e.g., ADCs in the first stage 411-0, . . . , 411-m). Each further switch (e.g., switch 415-0) may be configured to selectively bypass the respective ADC of the third type (e.g., ADC in the first stage 411-0) according to the resolution of the analog-to-digital conversion (e.g., target resolution). Each further switch (e.g., switch 415-0) may be configured to bypass the respective ADC of the third type (e.g., ADC in the first stage 411-0) responsive to the resolution of the conversion being below a second threshold that is greater than the first threshold (e.g., a resolution threshold for the ADCs in the first stage is greater than a resolution threshold for the ADCs in the second stage; in other words, if an ADC in the second stage is bypassed, an ADC in the first stage is also bypassed).

In some embodiments, the system may include a controller (e.g., controller 490) configured to determine a quantity of switches (e.g., (1) number of switches that are currently active or turned on or (2) number of active channels currently performing analog-to-digital conversions), among the plurality of switches (e.g., switches 420-0, 420-2, . . . , 420-m), that respectively turn on the selected quantity of ADCs of the second type. The controller may determine a first rate of an analog-to-digital conversion (e.g., the rate or speed actually achieved by turning on the selected quantity of ADCs of the second type in the active channels) as a result of the quantity of switches respectively turning on the selected quantity of ADCs of the second type. The controller may determine whether the first rate of the analog-to-digital conversion is less than the rate of the analog-to-digital conversion (e.g., whether the current rate or speed of the reconfigurable ADC 4000 is less than the target rate or speed of the reconfigurable ADC 4000). Responsive to determining that the first rate of the analog-to-digital conversion is less than the rate of the analog-to-digital conversion, the controller may increase the selected quantity of ADCs of the second type to a second quantity of ADCs of the second type. For example, if the current rate or speed is less than the target rate or speed, the controller may turn on more ADCs of the second type so that the number of ADCs of the second type turned on in the third stage is the second quantity of ADCs of the second type. The controller may determine a second rate of an analog-to-digital conversion (e.g., the rate or speed actually achieved by turning on the second quantity of ADCs of the second type in the active channels) as a result of the quantity of switches respectively turning on the second quantity of ADCs of the second type. The controller may determine whether the second rate of the analog-to-digital conversion is less than the rate of the analog-to-digital conversion (e.g., whether the current rate or speed of the reconfigurable ADC 4000 is still less than the target rate or speed of the reconfigurable ADC 4000). Responsive to determining that the second rate of the analog-to-digital conversion is less than the rate of the analog-to-digital conversion, the controller may increase the quantity of switches to a second quantity of switch. The controller may control the second quantity of switches to respectively turn on the second quantity of ADCs of the second type. For example, if the current rate or speed is still less than the target rate or speed, the controller may turn on more channels or switches so that the number of switches (or number active channels) turning on the second quantity of ADCs in the third stage is the second quantity of switches.

In some embodiments, an ADC (e.g., a reconfigurable multi-channel ADC 4000) may include a plurality of hybrid ADCs (e.g., 410-0, ..., 410-m) in respective channels (e.g., Ch0, ..., CHm) and a controller (e.g., controller 490). Each of the plurality of hybrid ADCs (e.g., 410-0) may include one or more ADCs of a first type (e.g., ADCs in the first stage 411, ADCs in the second stage 412-0) and a plurality of ADCs of a second type (e.g., SAR ADCs in the third stages 413-0). An ADC of the second type (e.g., a SAR ADC 220-0) may have power efficiency greater than power efficiency of an ADC of the first type (e.g., a pipelined ADC 210-1 including MDAC 215). The controller may be configured to determine a first quantity indicating a number of ADCs of the second type (e.g., the number of SAR ADCs in the third stage 413-0) and a second quantity indicating a number of channels (e.g., the number of channels selected to perform an analog-to-digital conversion). The controller may be configured to control (1) the second quantity of hybrid ADCs, among the plurality of hybrid ADCs, in the second quantity of channels and (2) the first quantity of ADCs of the second type, among the plurality of ADCs of the second type, in each of the second quantity of channels, to perform a first analog-to-digital conversion. Responsive to determining that a speed of the first analog-to-digital conversion is less than a first speed (e.g., a target speed of the reconfigurable multi-channel ADC 4000), the controller may be configured to control the second quantity of hybrid ADCs in the second quantity of channels and a third quantity of ADCs of the second type in each of the second quantity of channels to perform a second analog-to-digital conversion, the third quantity being greater than the first quantity (e.g., the number of ADCs of the second type is increased from the first quantity to the third quantity). Responsive to determining that a speed of the second analog-to-digital conversion is less than the first speed, the controller may be configured to control a fourth quantity of hybrid ADCs in the fourth quantity of channels and the third quantity of ADCs of the second type in each of the fourth quantity of channels to perform a third analog-to-digital conversion, the fourth quantity being greater than the second quantity (e.g., the number of channels is increased from the second quantity to the fourth quantity). For example, to increase the speed (e.g., conversion rate or sampling rate) of an analog-to-digital conversion in a reconfigurable multi-channel ADC, the controller may first increase the number of SAR ADCs in each channel to determine whether the speed of the conversion satisfies a target speed, since SAR ADCs have greater power efficiency (e.g., compared to pipelined ADCs including MDAC). Responsive to determining that the speed of the conversion does not satisfy the target speed (e.g., the speed of the conversion is less than the target speed), the controller may increase the number of channels.

FIG. 5 is a flow diagram showing a process 5000 of reconfiguring a hybrid ADC including different types of ADCs, in accordance with an embodiment. In some embodiments, the process 5000 is performed by a reconfigurable hybrid ADC (e.g. ADCs 1000, 2000, 3000, 4000). In other embodiments, the process 5000 is performed by other entities. In some embodiments, the process 5000 includes more, fewer, or different steps than shown in FIG. 5.

At step 502, a plurality of switches (e.g., first switches 221-0, ..., 221-n) coupling a first ADC of a first type (e.g., pipelined ADC 210-1) to a plurality of ADCs of a second type (e.g., SAR ADCs 220-0, ..., 220-n) may select, based on a rate of an analog-to-digital conversion (e.g., a target conversion rate of an ADC indicated by a signal 292 inputted to the controller 290), a quantity of ADCs of the second type (e.g., two SAR ADCs 220-0, 220-1), from among the plurality of ADCs of the second type (e.g., SAR ADCs 220-0, ..., 220-n), to supply the analog-to-digital conversion at the rate. In some embodiments, the first ADC of the first type may include an MDAC (e.g., MDAC 215). The first type of ADC (e.g., pipelined ADC including a ping-pong type MDAC) may be different from the second type of ADCs (e.g., SAR ADCs). The plurality of ADCs of the second type may include time-interleaved SAR ADCs. The quantity of ADCs of the second type may be selected such that the selected quantity of ADCs of the second type increases as the rate of the analog-to-digital conversion (e.g., target conversion rate) increases. For example, two lanes of SAR ADCs can be selected for the target conversion rate of 800 MHz while one lane of SAR ADC can be selected for the target conversion rate of 400 MHz or 125 MHz.

At step 504, responsive to a resolution of the analog-to-digital conversion (e.g., a target resolution or accuracy of an ADC indicated by a signal 291 inputted to the controller 290) being below a threshold (e.g., 12 bits or 10 bit ENOB), the plurality of switches (e.g., second switches 222-0, ..., 222-n) may bypass the first ADC (e.g., pipelined ADC 210-1). In some embodiments, the plurality of switches may include a plurality of multiplexers (e.g., multiplexers 330-0, ..., 330-n) respectively electrically coupled to the plurality of ADCs of the second type (e.g., ADCs 320-0, ..., 320-n). In bypassing the first ADC, responsive to the resolution of the analog-to-digital conversion being below the threshold, each multiplexer may bypass the first ADC (e.g., by providing a selection signal 331 indicating the second value ("1") to each multiplexer).

At step 506, responsive to the resolution of the analog-to-digital conversion being greater than or equal to the threshold (e.g., 12 bits or 10 bit ENOB), the plurality of switches (e.g., first switches 221-0, ..., 221-n) may connect the first ADC (e.g., pipelined ADC 210-1) to the selected quantity of ADCs of the second type (e.g., two SAR ADCs 220-0, 220-1). In connecting the first ADC to the selected quantity of ADCs of the second type, responsive to the resolution of the analog-to-digital conversion being greater than or equal to the threshold, the plurality of multiplexers may connect the first ADC to the selected quantity of ADCs of the second type (e.g., by providing a selection signal 331 indicating the first value ("0") to each multiplexer). In some embodiments, in response to receiving an input signal (e.g., first analog signal 201), the first ADC (e.g., ADC 210-1) may convert the input signal to a first digital signal (e.g., first digital signal 241) and output an analog signal (e.g., second analog signal 203). In response to receiving the analog signal (e.g., second analog signal 203), the plurality of ADCs of the second type (e.g., SAR ADCs 220-0, ..., 220-n) may convert the analog signal to a second digital signal (e.g., second digital signal 242-0, ..., 242-n).

The term "coupled" and variations thereof includes the joining of two members directly or indirectly to one another. The term "electrically coupled" and variations thereof includes the joining of two members directly or indirectly to one another through conductive materials (e.g., metal, copper traces, or wires). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C #, or in any byte code language such as JAVA. The software programs or executable instructions can be stored on or in one or more articles of manufacture as object code. In some embodiments, the ADC is employed as an integrated circuit in a transmitter for wireless communication. The ADC is provided on an integrated circuit that includes the calibration engine. The ADC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system comprising:
   a first analog-to-digital converter (ADC) of a first type electrically coupled by a plurality of switches to a plurality of ADCs of a second type, wherein
   the plurality of switches are configured to:
   select, based on a rate of an analog-to-digital conversion, a quantity of ADCs of the second type, from among the plurality of ADCs of the second type, to supply the analog-to-digital conversion at the rate; and
   selectively bypass the first ADC according to a resolution of the analog-to-digital conversion,
   wherein the plurality of switches are configured to bypass the first ADC responsive to the resolution of the conversion being below a threshold.

2. The system of claim 1, wherein the first ADC of the first type comprises a multiplying digital-to-analog converter (MDAC).

3. The system of claim 2, wherein the MDAC is configured to perform a double sampling or a ping-pong sampling.

4. The system of claim 1, wherein the plurality of ADCs of the second type comprise time-interleaved successive approximation register (SAR) ADCs.

5. The system of claim 1, wherein the selected quantity of ADCs of the second type increases as the rate of the analog-to-digital conversion increases.

6. The system of claim 1, wherein
   the plurality of switches comprise a plurality of multiplexers respectively electrically coupled to the plurality of ADCs of the second type, and
   each multiplexer is configured to selectively bypass the first ADC responsive to the resolution of the conversion being below the threshold.

7. The system of claim 1, wherein
   in response to receiving an input signal, the first ADC is configured to convert the input signal to a first digital signal and output an analog signal, and
   in response to receiving the analog signal, the plurality of ADCs of the second type are configured to convert the analog signal to a second digital signal.

8. A method comprising:
   selecting, by a plurality of switches coupling a first analog-to-digital converter (ADC) of a first type to a plurality of ADCs of a second type, based on a rate of an analog-to-digital conversion, a quantity of ADCs of the second type, from among the plurality of ADCs of the second type, to supply the analog-to-digital conversion at the rate;
   responsive to a resolution of the analog-to-digital conversion being below a threshold, bypassing, by the plurality of switches, the first ADC; and responsive to the resolution of the analog-to-digital conversion being greater than or equal to the threshold, connecting, by the plurality of switches, the first ADC to the selected quantity of ADCs of the second type.

9. The method of claim 8, wherein the first ADC of the first type comprises a multiplying digital-to-analog converter (MDAC).

10. The method of claim 9, wherein the MDAC is configured to perform a double sampling or a ping-pong sampling.

11. The method of claim 8, wherein the plurality of ADCs of the second type comprise time-interleaved successive approximation register (SAR) ADCs.

12. The method of claim 8, wherein the quantity of ADCs of the second type is selected such that the selected quantity of ADCs of the second type increases as the rate of the analog-to-digital conversion increases.

13. The method of claim 8, wherein
the plurality of switches comprise a plurality of multiplexers respectively electrically coupled to the plurality of ADCs of the second type,
bypassing the first ADC comprises:
responsive to the resolution of the analog-to-digital conversion being below the threshold, bypassing, by each multiplexer, the first ADC, and
connecting the first ADC to the selected quantity of ADCs of the second type comprises:
responsive to the resolution of the analog-to-digital conversion being greater than or equal to the threshold, connecting, by the plurality of multiplexers, the first ADC to the selected quantity of ADCs of the second type.

14. The method of claim 8, further comprising:
in response to receiving an input signal, converting, by the first ADC, the input signal to a first digital signal and output an analog signal; and
in response to receiving the analog signal, converting, by the plurality of ADCs of the second type, the first analog signal to a second digital signal.

15. A system comprising:
a plurality of analog-to-digital converters (ADCs) of a first type electrically coupled to a plurality of switches, each ADC of the first type being electrically coupled by a respective switch to a plurality of ADCs of a second type, wherein
each switch is configured to:
select, based on a rate of an analog-to-digital conversion, a quantity of ADCs of the second type, from among the plurality of ADCs, to supply the analog-to-digital conversion at the rate; and
selectively bypass the respective ADC of the first type according to a resolution of the analog-to-digital conversion,
wherein each switch is configured to bypass the respective ADC of the first type responsive to the resolution of the conversion being below a first threshold.

16. The system of claim 15, wherein
each ADC of the first type comprises a multiplying digital-to-analog converter (MDAC), and
the plurality of ADCs of the second type comprise time-interleaved successive approximation register (SAR) ADCs.

17. The system of claim 15, wherein the selected quantity of ADCs of the second type increases as the rate of the analog-to-digital conversion increases.

18. The system of claim 15, wherein
each switch comprise a plurality of multiplexers respectively electrically coupled to the plurality of ADCs of the second type, and
each multiplexer is configured to selectively bypass the respective ADC of the first type responsive to the resolution of the conversion being below the threshold.

19. The system of claim 15, further comprising:
a plurality of ADCs of a third type respectively electrically coupled to the plurality of ADCs of the first type; and
a plurality of further switches respectively electrically coupled to the plurality of ADCs of the third type, each further switch configured to selectively bypass the respective ADC of the third type according to the resolution of the analog-to-digital conversion,
wherein each further switch is configured to bypass the respective ADC of the third type responsive to the resolution of the conversion being below a second threshold that is greater than the first threshold.

20. An analog-to-digital converter (ADC) comprising:
a plurality of hybrid ADCs in respective channels, each hybrid ADC including one or more ADCs of a first type and a plurality of ADCs of a second type wherein an ADC of the second type has power efficiency greater than power efficiency of an ADC of the first type;
a controller configured to:
determine a first quantity indicating a number of ADCs of the second type and a second quantity indicating a number of channels;
control (1) the second quantity of hybrid ADCs, among the plurality of hybrid ADCs, in the second quantity of channels and (2) the first quantity of ADCs of the second type, among the plurality of ADCs of the second type, in each of the second quantity of channels, to perform a first analog-to-digital conversion;
responsive to determining that a speed of the first analog-to-digital conversion is less than a first speed, control the second quantity of hybrid ADCs in the second quantity of channels and a third quantity of ADCs of the second type in each of the second quantity of channels to perform a second analog-to-digital conversion, the third quantity being greater than the first quantity; and
responsive to determining that a speed of the second analog-to-digital conversion is less than the first speed, control a fourth quantity of hybrid ADCs in the fourth quantity of channels and the third quantity of ADCs of the second type in each of the fourth quantity of channels to perform a third analog-to-digital conversion, the fourth quantity being greater than the second quantity.

* * * * *